(12) United States Patent
Sobue

(10) Patent No.: US 12,446,301 B2
(45) Date of Patent: Oct. 14, 2025

(54) SEMICONDUCTOR INTEGRATED CIRCUIT DEVICE

(71) Applicant: Socionext Inc., Kanagawa (JP)

(72) Inventor: Isaya Sobue, Yokohama (JP)

(73) Assignee: Socionext Inc., Kanagawa (JP)

( * ) Notice: Subject to any disclaimer, the term of this patent is extended or adjusted under 35 U.S.C. 154(b) by 560 days.

(21) Appl. No.: 17/902,537

(22) Filed: Sep. 2, 2022

(65) Prior Publication Data

US 2022/0415885 A1  Dec. 29, 2022

Related U.S. Application Data

(63) Continuation of application No. PCT/JP2021/008218, filed on Mar. 3, 2021.

(30) Foreign Application Priority Data

Mar. 11, 2020 (JP) ................................ 2020-041830

(51) Int. Cl.
*H01L 27/07* (2006.01)
*H01L 23/528* (2006.01)
(Continued)

(52) U.S. Cl.
CPC ....... *H10D 84/813* (2025.01); *H01L 23/5283* (2013.01); *H10D 30/43* (2025.01); *H10D 30/6757* (2025.01); *H10D 62/121* (2025.01)

(58) Field of Classification Search
CPC .. H10D 84/813; H10D 30/43; H10D 30/6757; H10D 62/121; H10D 1/66;
(Continued)

(56) References Cited

U.S. PATENT DOCUMENTS

| | | |
|---|---|---|
| 2016/0111337 A1 | 4/2016 | Hatcher et al. |
| 2017/0069481 A1 | 3/2017 | Doris et al. |
| | (Continued) | |

FOREIGN PATENT DOCUMENTS

| | | |
|---|---|---|
| JP | H05-067634 A | 3/1993 |
| JP | H08-306870 A | 11/1996 |
| | (Continued) | |

OTHER PUBLICATIONS

International Search Report (ISR) dated Jun. 1, 2021 issued in International Patent Application No. PCT/JP2021/008218 with English translation.
(Continued)

*Primary Examiner* — Tong-Ho Kim
(74) *Attorney, Agent, or Firm* — Rimon P.C.

(57) ABSTRACT

A layout structure of a capacitive element using forksheet FETs is provided. A capacitive structure constituting the capacitive element includes: a first transistor having a first nanosheet extending in the X direction and a first gate interconnect extending in the Y direction and surrounding the periphery of the first nanosheet; and a second transistor having a second nanosheet extending in the X direction and a second gate interconnect extending in the Y direction and surrounding the periphery of the second nanosheet. The face of the first nanosheet closer to the second nanosheet is exposed from the first gate interconnect, and the face of the second nanosheet closer to the first nanosheet is exposed from the second gate interconnect.

15 Claims, 13 Drawing Sheets

(51) Int. Cl.
*H01L 29/06* (2006.01)
*H01L 29/775* (2006.01)
*H01L 29/786* (2006.01)
*H10D 30/43* (2025.01)
*H10D 30/67* (2025.01)
*H10D 62/10* (2025.01)
*H10D 84/80* (2025.01)

(58) Field of Classification Search
CPC ............ H10D 30/014; H10D 30/6735; H10D 84/811; H01L 23/5283; B82Y 10/00
USPC ....................................................... 257/288
See application file for complete search history.

(56) References Cited

U.S. PATENT DOCUMENTS

| | | |
|---|---|---|
| 2018/0090624 A1 | 3/2018 | Cheng et al. |
| 2019/0123063 A1 | 4/2019 | Hino et al. |
| 2019/0164993 A1 | 5/2019 | Shimbo |
| 2019/0198530 A1 | 6/2019 | Hino et al. |
| 2020/0286918 A1 | 9/2020 | Hino et al. |
| 2020/0335488 A1 | 10/2020 | Iwahori |
| 2021/0028191 A1 | 1/2021 | Hino et al. |
| 2021/0104552 A1 | 4/2021 | Shimbo |
| 2021/0183711 A1* | 6/2021 | Dentoni Litta ...... H10D 84/038 |
| 2021/0242242 A1 | 8/2021 | Hino et al. |
| 2021/0366902 A1* | 11/2021 | Sobue ................... H10D 88/01 |

FOREIGN PATENT DOCUMENTS

| | | |
|---|---|---|
| JP | 2009-016525 A | 1/2009 |
| WO | 2018/003634 A1 | 1/2018 |
| WO | 2018/025580 A1 | 2/2018 |
| WO | 2018/042986 A1 | 3/2018 |
| WO | 2019/138546 A1 | 7/2019 |

OTHER PUBLICATIONS

P. Weckx et al., "Stacked nanosheet fork architecture for SRAM design and device co-optimization toward 3nm", 2017 IEEE International Electron Devices Meeting (IEDM), Dec. 2017, IEDM17-505~508.

P. Weckx et al., "Novel forksheet device architecture as ultimate logic scaling device towards 2nm", 2019 IEEE International Electron Devices Meeting (IEDM), Dec. 2019, IEDM19-871~874.

* cited by examiner

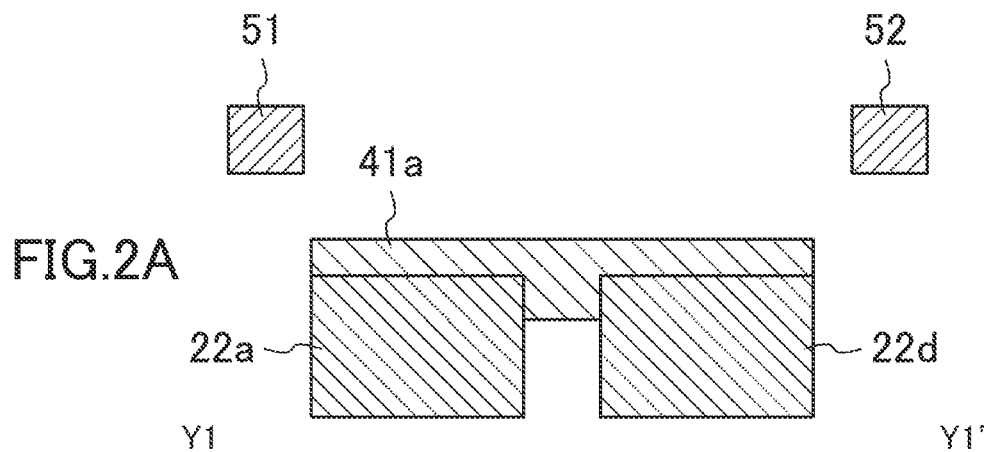
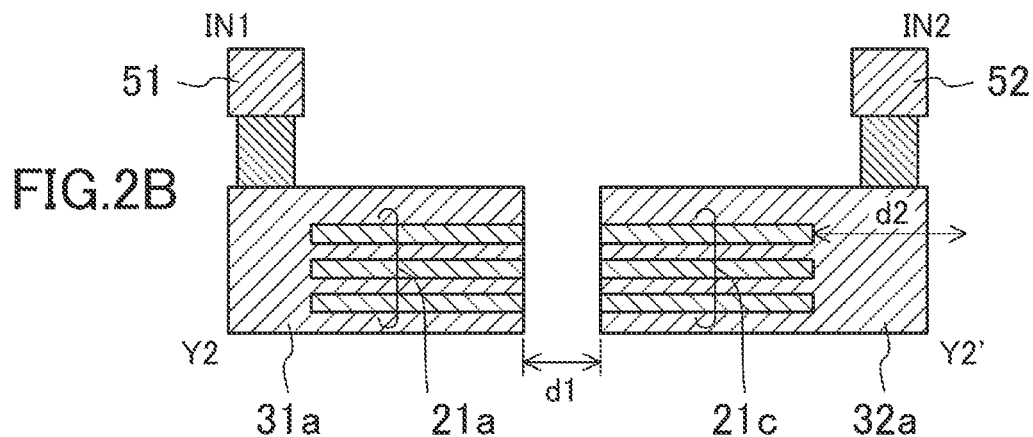
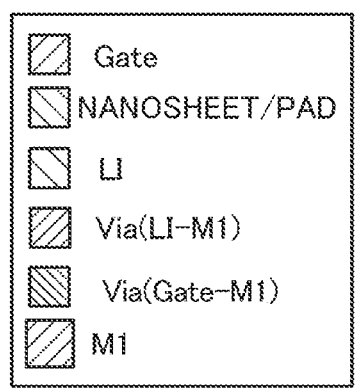

FIG.11
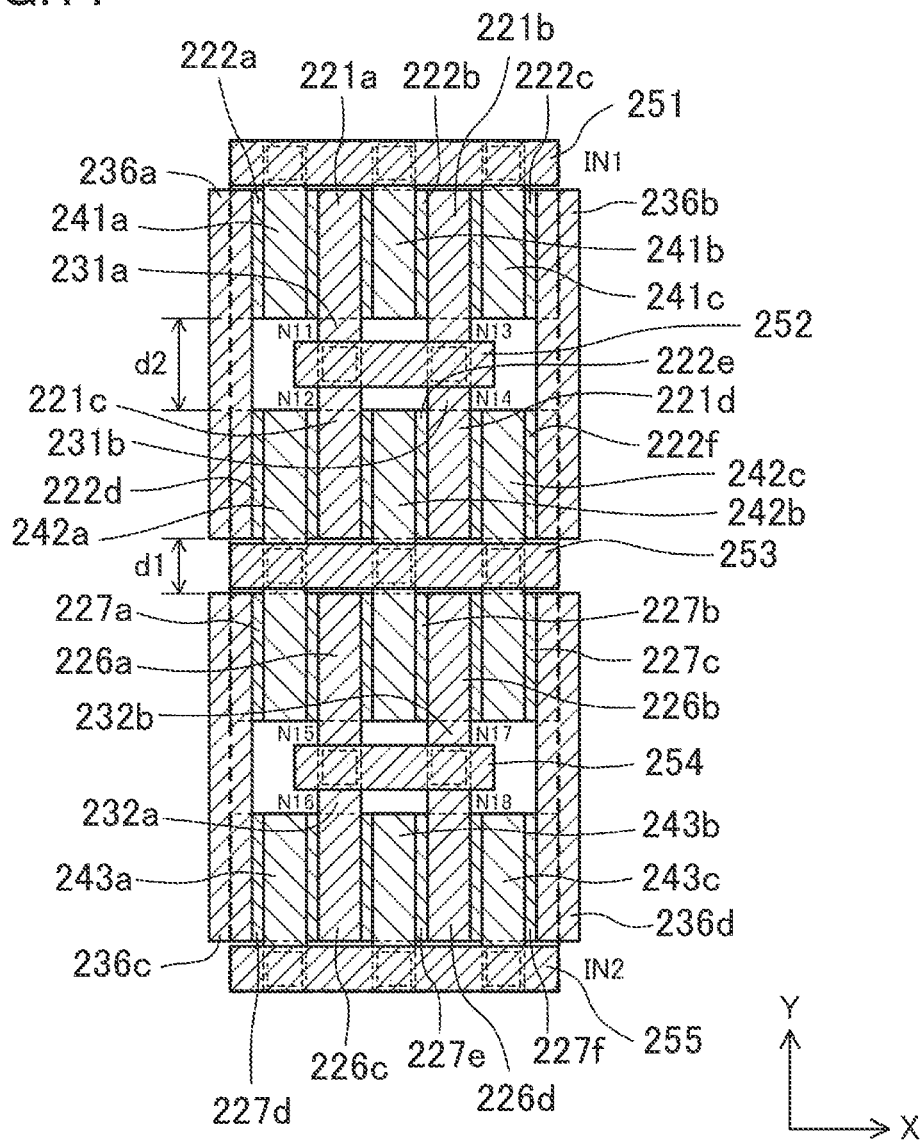
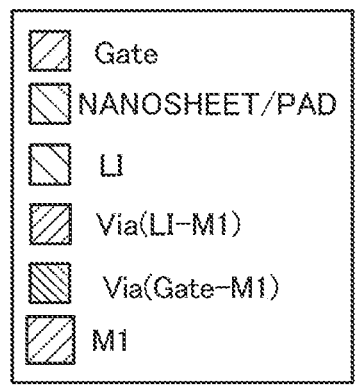

FIG.13A
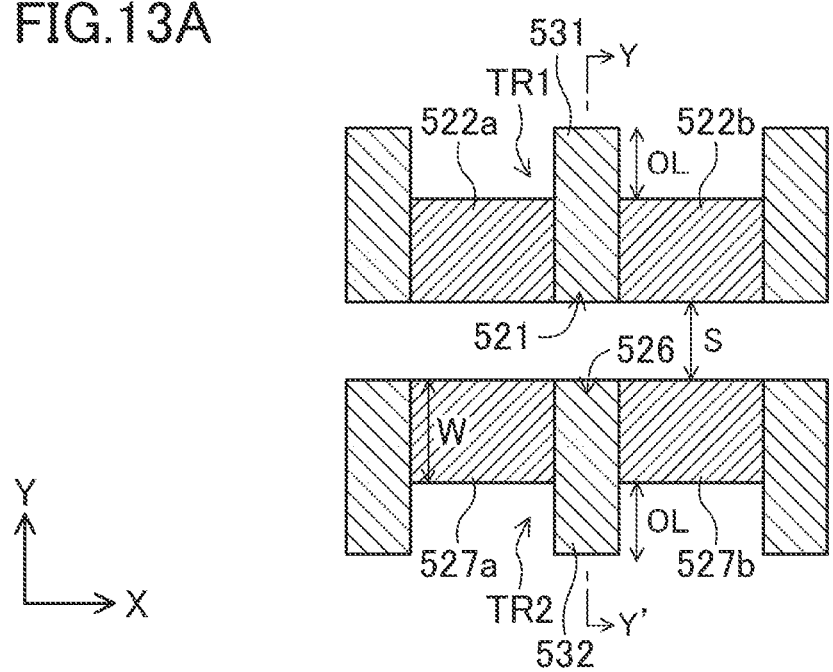
FIG.13B
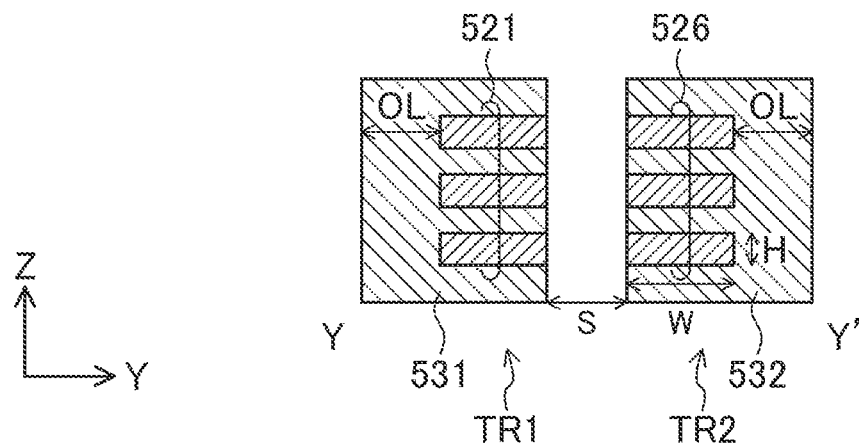
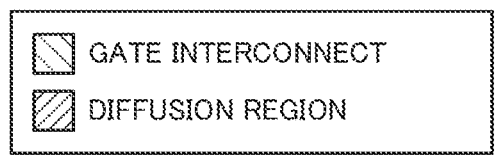

SEMICONDUCTOR INTEGRATED CIRCUIT DEVICE

CROSS-REFERENCE TO RELATED APPLICATIONS

This is a continuation of International Application No. PCT/JP2021/008218 filed on Mar. 3, 2021, which claims priority to Japanese Patent Application No. 2020-041830 filed on Mar. 11, 2020. The entire disclosures of these applications are incorporated by reference herein.

BACKGROUND

The present disclosure relates to a semiconductor integrated circuit device provided with nanosheet (nanowire) field effect transistors (FETs).

In semiconductor integrated circuit devices, along with the miniaturization of processes, the breakdown voltage of transistors tends to become lower. On the other hand, some of interfaces conducting signal input/output with the outside of the device require a high voltage exceeding the breakdown voltage of transistors depending on their specifications, etc.

A capacitive element is one of basic elements constituting a semiconductor integrated circuit. In a semiconductor integrated circuit device, the capacitive element is formed using transistors in some cases.

As for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet (nanowire) FETs have received attention.

Japanese Unexamined Patent Publication No. H08-306870 discloses a high-breakdown voltage capacitive element formed by serial connection of transistors.

P. Weckx et al., "Stacked nanosheet fork architecture for SRAM design and device co-optimization toward 3 nm," 2017 IEEE International Electron Devices Meeting (IEDM), December 2017, IEDM17-505-508 (Document 1), and P. Weckx et al., "Novel forksheet device architecture as ultimate logic scaling device towards 2 nm," 2019 IEEE International Electron Devices Meeting (IEDM), December 2019, IEDM19-871-874 (Document 2) disclose layouts of SRAM cells and standard cells using nanosheet FETs each having a gate electrode shaped like a fork.

Note that the nanosheet FET having a fork-shaped gate electrode is hereinafter called a forksheet FET following the naming in Document 1.

As of today, however, no examination has been made on the layout structure of a high-breakdown voltage capacitance using forksheet FETs.

An objective of the present disclosure is providing a layout structure of a capacitive element having a high breakdown voltage formed using forksheet FETs.

SUMMARY

According to the first mode of the present disclosure, a semiconductor integrated circuit device including a capacitive element is provided. The capacitive element has at least one capacitive structure provided between a first node and a second node, wherein the capacitive structure includes: a first transistor having a first nanosheet extending in a first direction and a first gate interconnect extending in a second direction perpendicular to the first direction formed to surround a periphery of the first nanosheet in the second direction and a third direction perpendicular to the first and second directions; and a second transistor having a second nanosheet extending in the first direction and a second gate interconnect extending in the second direction formed to surround a periphery of the second nanosheet in the second and third directions, the first and second transistors are adjacent to each other in the second direction and mutually connected at at least one node, and the first nanosheet and the second nanosheet are opposed to each other in the second direction, a face of the first nanosheet closer to the second nanosheet is exposed from the first gate interconnect, and a face of the second nanosheet closer to the first nanosheet is exposed from the second gate interconnect.

According to the above mode, a capacitive structure constituting the capacitive element includes: a first transistor having a first nanosheet extending in the first direction and a first gate interconnect extending in the second direction and surrounding the periphery of the first nanosheet; and a second transistor having a second nanosheet extending in the first direction and a second gate interconnect extending in the second direction and surrounding the periphery of the second nanosheet. The first and second transistors are adjacent to each other in the second direction and mutually connected at at least either one node. The first nanosheet and the second nanosheet are opposed to each other in the second direction, the face of the first nanosheet closer to the second nanosheet is exposed from the first gate interconnect, and the face of the second nanosheet closer to the first nanosheet is exposed from the second gate interconnect. This can reduce the distance between the first nanosheet and the second nanosheet required to isolate the gate of the first transistor from the gate of the second transistor. Therefore, since the size of the capacitive element in the second direction can be reduced, a layout structure of a capacitive element having a high breakdown voltage formed using forksheet FETs can be implemented in a reduced area.

According to the second mode of the present disclosure, a semiconductor integrated circuit device including a capacitive element is provided. The capacitive element has at least one capacitive structure provided between a first node and a second node, wherein the capacitive structure includes: a first transistor having a first nanosheet extending in a first direction and a first gate interconnect extending in a second direction perpendicular to the first direction formed to surround a periphery of the first nanosheet in the second direction and a third direction perpendicular to the first and second directions; and a second transistor having a second nanosheet extending in the first direction and a second gate interconnect extending in the second direction formed to surround a periphery of the second nanosheet in the second and third directions, the first and second transistors are adjacent to each other in the first direction and mutually connected at one node, and a face of the first nanosheet on a first side in the second direction is exposed from the first gate interconnect, and a face of the second nanosheet on the first side in the second direction is exposed from the second gate interconnect.

According to the above mode, a capacitive structure constituting the capacitive element includes: a first transistor having a first nanosheet extending in the first direction and a first gate interconnect extending in the second direction and surrounding the periphery of the first nanosheet; and a second transistor having a second nanosheet extending in the first direction and a second gate interconnect extending in the second direction and surrounding the periphery of the second nanosheet. The first and second transistors are adjacent to each other in the first direction and mutually connected at one node. The face of the first nanosheet on the first side in the second direction is exposed from the first gate interconnect, and the face of the second nanosheet on the first side in the second direction is exposed from the second gate interconnect. This can reduce the distance between this capacitive structure and another capacitive structure adjacent thereto on the first side in the second direction. Therefore, since the size of the capacitive element in the second direction can be reduced, a layout structure of a capacitive element having a high breakdown voltage formed using forksheet FETs can be implemented in a reduced area.

According to the third mode of the present disclosure, a semiconductor integrated circuit device including a capacitive element is provided. The capacitive element has at least one capacitive structure provided between a first node and a second node, wherein the capacitive structure includes: a first transistor having a first nanosheet extending in a first direction; and a second transistor having a second nanosheet extending in the first direction, the first and second transistors are adjacent to each other in a second direction perpendicular to the first direction, a first gate interconnect extending in the second direction is formed to surround peripheries the first and second nanosheets in the second direction and a third direction perpendicular to the first and second directions, and a face of the second nanosheet on a side away from the first nanosheet in the second direction is exposed from the first gate interconnect.

According to the above mode, a capacitive structure constituting the capacitive element includes a first transistor having a first nanosheet extending in the first direction and a second transistor having a second nanosheet extending in the first direction. The first and second transistors are adjacent to each other in the second direction, and a first gate interconnect extending in the second direction is formed to surround the peripheries of the first and second nanosheets. The face of the second nanosheet away from the first nanosheet in the second direction is exposed from the first gate interconnect. This can reduce the distance between this capacitive structure and another capacitive structure adjacent thereto on the second transistor side in the second direction. Therefore, since the size of the capacitive element in the second direction can be reduced, a layout structure of a capacitive element having a high breakdown voltage formed using forksheet FETs can be implemented in a reduced area.

According to the present disclosure, a capacitive element having a high breakdown voltage can be implemented using forksheet FETs.

BRIEF DESCRIPTION OF THE DRAWINGS

FIGS. 2A-2B are cross-sectional views of the layout structure of FIG. 1 taken vertically as viewed in plan.

FIG. 11 is a plan view showing a layout structure of a capacitive element according to an alteration of the third embodiment.

FIGS. 13A-13B are views showing a basic structure of a forksheet FET, where FIG. 13A is a plan view and FIG. 13B is a cross-sectional view.

DETAILED DESCRIPTION

Figure 1:
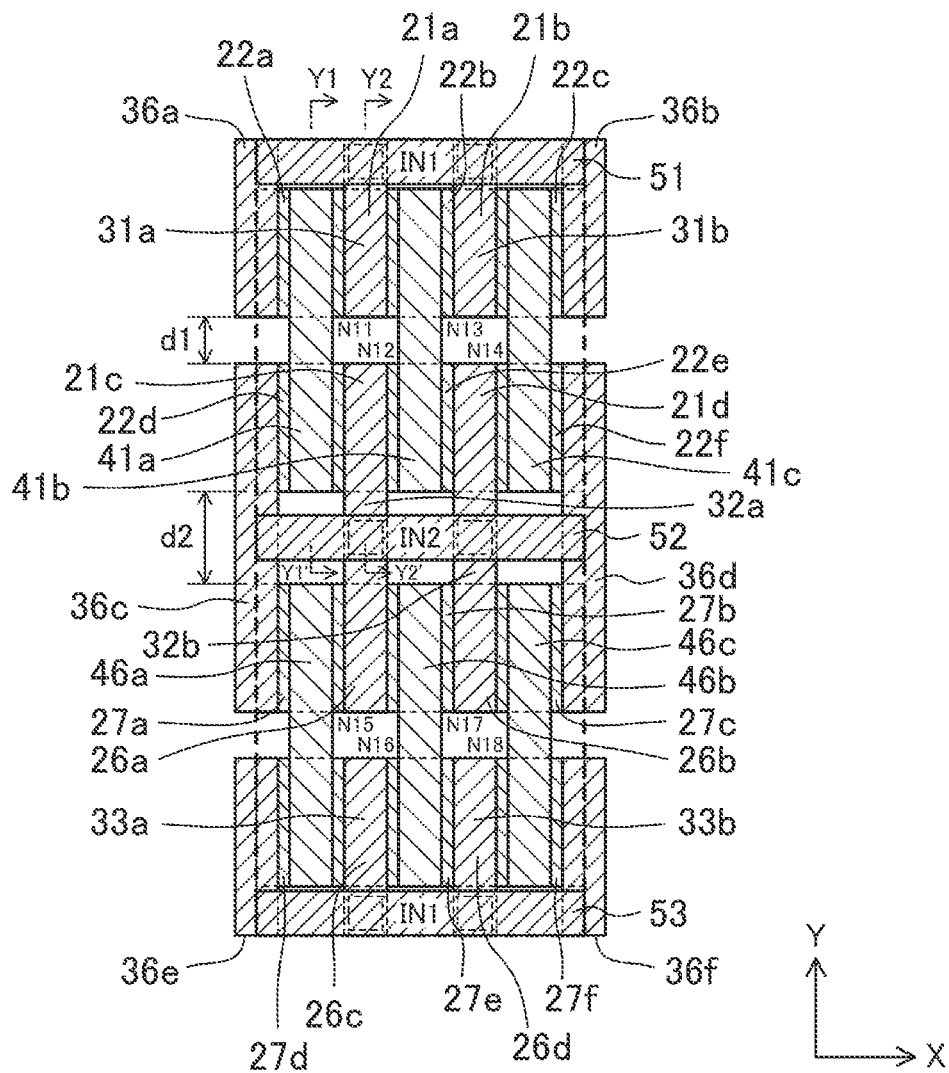
FIG. 1 is a plan view showing a layout structure of a capacitive element according to the first embodiment.

Embodiments of the present disclosure will be described hereinafter with reference to the accompanying drawings. In the following embodiments, it is assumed that the semiconductor integrated circuit device includes a plurality of standard cells (hereinafter simply called cells as appropriate), and at least some of the standard cells include forksheet field effect transistors (FETs). The nanosheet FET is a FET using a thin sheet (nanosheet) through which a current flows. Such a nanosheet is formed of silicon, for example. In the semiconductor integrated circuit device, it is assumed that some of the nanosheet FETs are forksheet FETs each having a fork-shaped gate electrode.

In the present disclosure, a semiconductor layer portion formed on each end of a nanosheet to constitute a terminal that is to be the source or drain of a nanosheet FET is called a "pad."

First, the basic structure of a forksheet FET will be described.

FIGS. 13A-13B are views showing a basic structure of a forksheet FET, where FIG. 13A is a plan view and FIG. 13B is a cross-sectional view taken along line Y-Y' in FIG. 13A. In the basic structure of FIGS. 13A-13B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 13A-13B, the channel portions 521 and 526 are each constituted by a stacked structure of three nanosheets overlapping as viewed in plan. Pads 522*a* and 522*b* that are to be the source and drain regions of the transistor TR1 are formed on both sides of the channel portion 521 in the X direction. Pads 527*a* and 527*b* that are to be the source and drain regions of the transistor TR2 are formed on both sides of the channel portion 526 in the X direction. The pads 522*a* and 522*b* are formed by epitaxial growth from the nanosheets constituting the channel portion 521. The pads 527*a* and 527*b* are formed by epitaxial growth from the nanosheets constituting the channel portion 526.

The gate interconnect 531 surrounds the peripheries of the nanosheets constituting the channel portion 521 in the Y and Z directions via gate insulating films (not shown). Note however that the faces of the nanosheets constituting the channel portion 521 on the side closer to the transistor TR2 in the Y direction are exposed from the gate interconnect 531, not covered with the gate interconnect 531. That is, in the cross-sectional view of FIG. 13B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via gate insulating films (not shown). Note however that the faces of the nanosheets constituting the channel portion 526 on the side closer to the transistor TR1 in the Y direction are exposed from the gate interconnect 532, not covered with the gate interconnect 532. That is, in the cross-sectional view of FIG. 13B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 13A-13B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 13B, it is not limited to this. For example, the shape may be square, circular, or oval.

The semiconductor integrated circuit device may include both forksheet FETs and other nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations. Also, the source and drain of a transistor are herein called the "nodes" of the transistor as appropriate. That is, one node of a transistor refers to the source or drain of the transistor, and both nodes of a transistor refer to the source and drain of the transistor.

First Embodiment

FIGS. 1 and 2A-2B are views showing a layout structure of a capacitive element according to the first embodiment, where FIG. 1 is a plan view and FIGS. 2A-2B are cross-sectional views taken vertically as viewed in plan. Specifically, FIG. 2A shows a cross section taken along line Y1-Y1' and FIG. 2B shows a cross section taken along line Y2-Y2'.

Note that, in the plan views such as FIG. 1, the horizontal direction in the figure is hereinafter referred to as an X direction (corresponding to the first direction), the vertical direction in the figure as a Y direction (corresponding to the second direction), and the direction perpendicular to the substrate plane as a Z direction (corresponding to the third direction).

Figure 3:
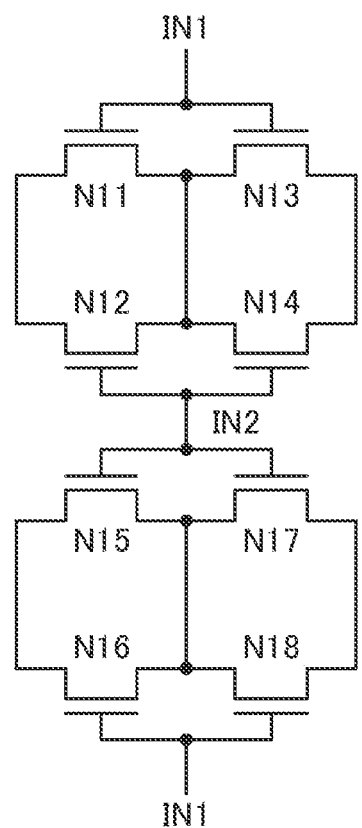
FIG. 3 is a circuit diagram of the capacitive element shown in FIGS. 1 and 2A-2B.

FIG. 3 is a circuit diagram showing the configuration of the capacitive element shown in FIGS. 1 and 2A-2B. The semiconductor integrated circuit device according to this embodiment includes the capacitive element shown in FIG. 3. Nodes IN1 and IN2 receive signals, for example. Otherwise, the nodes IN1 and IN2 are connected to power supply lines. In this case, the capacitive element functions as an inter-power supply capacitance. This also applies to capacitive elements to follow.

The capacitive element of FIG. 3 is connected to two nodes IN1. N-type transistors N11, N12, N13, and N14 are placed between one of the nodes IN1 and the node IN2. The gates of the transistors N11 and N13 are connected to the node IN1, and the gates of the transistors N12 and N14 are connected to the node IN2. The transistors N11 and N12 are mutually connected at both nodes, and the transistors N13 and N14 are mutually connected at both nodes. The transistors N11 and N13 share one node, and the transistors N12 and N14 share one node.

Also, n-type transistors N15, N16, N17, and N18 are placed between the other of the nodes IN1 and the node IN2. The connection relations among the transistors N15 to N18 are similar to those among the transistors N11 to N14, and therefore detailed description thereof is omitted here.

In the configuration of FIG. 3, the voltage applied to the transistors N11 to N14 and N15 to N18 is ½ of the voltage across the nodes IN1-IN2. It is therefore possible to apply, this capacitive element, a voltage higher than the breakdown voltage of the transistors N11 to N14 and N15 to N18.

The capacitive element of FIG. 3 has a configuration of four capacitive structures, each constituted by two transistors mutually connected at the source and the drain, provided between the node IN1 and the node IN2. That is, the capacitive element of FIG. 3 includes a capacitive structure made of the transistors N11 and N12, a capacitive structure made of the transistors N13 and N14, a capacitive structure made of the transistors N15 and N16, and a capacitive structure made of the transistors N17 and N18.

As shown in FIG. 1, the n-type transistors N11 to N18 are arranged in an array of two in the X direction and four in the Y direction. That is, the transistors N11 and N13 are arranged side by side in the X direction, the transistors N12 and N14 are arranged side by side in the X direction, the transistors N15 and N17 are arranged side by side in the X direction, and the transistors N16 and N18 are arranged side by side in the X direction. The transistors N11, N12, N15, and N16 are arranged in a line in the Y direction, and the transistors N13, N14, N17, and N18 are arranged in a line in the Y direction.

The transistors N11 to N14 have, as channel portions, nanosheets 21a, 21c, 21b, and 21d, respectively, each having a stacked structure of three sheets overlapping as viewed in plan. The transistors N15 to N18 have, as channel portions, nanosheets 26a, 26c, 26b, and 26d, respectively, each having a stacked structure of three sheets overlapping as viewed in plan. That is, the transistors N11 to N14 and N15 to N18 are nanosheet FETs.

As shown in FIG. 1, pads 22a, 22b, and 22c, each formed of an integral semiconductor layer connected to the stacked structure of three sheets, are formed on the left side of the nanosheets 21a in the figure, between the nanosheets 21a and 21b, and on the right side of the nanosheet 21b in the figure, respectively. The pads 22a and 22b are to be the source region and drain region of the transistor N11, and the pads 22b and 22c are to be the source region and drain region of the transistor N13. Pads 22d, 22e, and 22f, each formed of an integral semiconductor layer connected to the stacked structure of three sheets, are formed on the left side of the nanosheets 21c in the figure, between the nanosheets 21c and 21d, and on the right side of the nanosheet 21d in the figure, respectively. The pads 22d and 22e are to be the source region and drain region of the transistor N12, and the pads 22e and 22f are to be the source region and drain region of the transistor N14.

Pads 27a, 27b, and 27c, each formed of an integral semiconductor layer connected to the stacked structure of three sheets, are formed on the left side of the nanosheets 26a in the figure, between the nanosheets 26a and 26b, and on the right side of the nanosheet 26b in the figure, respectively. The pads 27a and 27b are to be the source region and drain region of the transistor N15, and the pads 27b and 27c are to be the source region and drain region of the transistor N17. Pads 27d, 27e, and 27f, each formed of an integral semiconductor layer connected to the stacked structure of three sheets, are formed on the left side of the nanosheets 26c in the figure, between the nanosheets 26c and 26d, and on the right side of the nanosheet 26d in the figure, respectively. The pads 27d and 27e are to be the source region and drain region of the transistor N16, and the pads 27e and 27f are to be the source region and drain region of the transistor N18.

Gate interconnects 31a and 31b extending in parallel in the Y direction are formed in the region of the transistors N11 and N13. Gate interconnects 32a and 32b extending in parallel in the Y direction are formed in the region of the transistors N12, N14, N15, and N17. Gate interconnects 33a and 33b extending in parallel in the Y direction are formed in the region of the transistors N16 and N18. The gate interconnects 31a, 32a, and 33a are arranged in a line in the Y direction, and the gate interconnects 31b, 32b, and 33b are arranged in a line in the Y direction. Also, dummy gate interconnects 36a and 36b are formed on the outer sides of the gate interconnects 31a and 31b in the X direction, dummy gate interconnects 36c and 36d are formed on the outer sides of the gate interconnects 32a and 32b in the X direction, and dummy gate interconnects 36e and 36f are formed on the outer sides of the gate interconnects 33a and 33b in the X direction.

The gate interconnect 31a surrounds the peripheries of the nanosheets 21a of the transistor N11 in the Y and Z directions through gate insulating films (not shown). The gate interconnect 31a is to be the gate of the transistor N11. The gate interconnect 31b surrounds the peripheries of the nanosheets 21b of the transistor N13 in the Y and Z directions through gate insulating films (not shown). The gate interconnect 31b is to be the gate of the transistor N13.

The gate interconnect 32a surrounds the peripheries of the nanosheets 21c of the transistor N12 and the nanosheets 26a of the transistor N15 in the Y and Z directions through gate insulating films (not shown). The gate interconnect 32a is to be the gates of the transistors N12 and N15. The gate interconnect 32b surrounds the peripheries of the nanosheets 21d of the transistor N14 and the nanosheets 26b of the transistor N17 in the Y and Z directions through gate insulating films (not shown). The gate interconnect 32b is to be the gates of the transistors N14 and N17.

The gate interconnect 33a surrounds the peripheries of the nanosheets 26c of the transistor N16 in the Y and Z directions through gate insulating films (not shown). The gate interconnect 33a is to be the gate of the transistor N16. The gate interconnect 33b surrounds the peripheries of the nanosheets 26d of the transistor N18 in the Y and Z directions through gate insulating films (not shown). The gate interconnect 33b is to be the gate of the transistor N18.

Local interconnects 41a, 41b, and 41c extending in parallel in the Y direction and local interconnects 46a, 46b, and 46c extending in parallel in the Y direction are formed in a local interconnect layer. The local interconnect 41a is connected with the pads 22a and 22d, the local interconnect 41b is connected with the pads 22b and 22e, and the local interconnect 41c is connected with the pads 22c and 22f. The local interconnect 46a is connected with the pads 27a and 27d, the local interconnect 46b is connected with the pads 27b and 27e, and the local interconnect 46c is connected with the pads 27c and 27f.

Metal interconnects 51, 52, and 53 extending in the X direction are formed in an M1 interconnect layer. The metal interconnects 51 and 53 correspond to the nodes IN1 of the capacitive element, and the metal interconnect 52 corresponds to the node IN2 of the capacitive element. The metal interconnect 51 is connected to the gate interconnects 31a and 31b through vias. The metal interconnect 52 is connected with the gate interconnects 32a and 32b through vias. The metal interconnect 53 is connected to the gate interconnects 33a and 33b through vias.

The nanosheets 21a and the nanosheets 21c are opposed to each other in the Y direction. The faces of the nanosheets 21a closer to the nanosheets 21c in the Y direction are exposed from the gate interconnect 31a, not covered with the gate interconnect 31a. The faces of the nanosheets 21c closer to the nanosheets 21a in the Y direction are exposed from the gate interconnect 32a, not covered with the gate interconnect 32a. Similarly, the nanosheets 21b and the nanosheets 21d are opposed to each other in the Y direction. The faces of the nanosheets 21b closer to the nanosheets 21d in the Y direction are exposed from the gate interconnect 31b, not covered with the gate interconnect 31b. The faces of the nanosheets 21d closer to the nanosheets 21b in the Y direction are exposed from the gate interconnect 32b, not covered with the gate interconnect 32b.

Also, the nanosheets 26a and the nanosheets 26c are opposed to each other in the Y direction. The faces of the nanosheets 26a closer to the nanosheets 26c in the Y direction are exposed from the gate interconnect 32a, not covered with the gate interconnect 32a. The faces of the nanosheets 26c closer to the nanosheets 26a in the Y direction are exposed from the gate interconnect 33a, not covered with the gate interconnect 33a. Similarly, the nanosheets 26b and the nanosheets 26d are opposed to each other in the Y direction. The faces of the nanosheets 26b closer to the nanosheets 26d in the Y direction are exposed from the gate interconnect 32b, not covered with the gate interconnect 32b. The faces of the nanosheets 26d closer to the nanosheets 26b in the Y direction are exposed from the gate interconnect 33b, not covered with the gate interconnect 33b.

The gates of the transistors N11 and N13 and the gates of the transistors N12 and N14 receive signals different from each other. It is therefore necessary to isolate the gate interconnect 31a and the gate interconnect 32a from each other, and the gate interconnect 31b and gate interconnect 32b from each other. On the other hand, with the configuration described above, the distance between the nanosheets 21a and 21c and between the nanosheets 21b and 21d can be reduced (d1<d2). Similarly, the gates of the transistors N15 and N17 and the gates of the transistors N16 and N18 receive signals different from each other. It is therefore necessary to isolate the gate interconnect 32a and the gate interconnect 33a from each other, and the gate interconnect 32b and gate interconnect 33b from each other. On the other hand, with the configuration described above, the distance between the nanosheets 26a and 26c and between the nanosheets 26b and 26d can be reduced.

Therefore, since the gates of the transistors placed between the nodes IN1 and IN2 can be isolated from each other with a small inter-nanosheet distance between them, the size of the capacitive element in the Y direction can be reduced.

As described above, according to this embodiment, a capacitive structure constituting the capacitive element includes, for example: the transistor N11 having the nanosheets 21a extending in the X direction and the gate interconnect 31a extending in the Y direction and surrounding the peripheries of the nanosheets 21a; and the transistor N12 having the nanosheets 21c extending in the X direction and the gate interconnect 32a extending in the Y direction and surrounding the peripheries of the nanosheets 21c. The transistors N11 and N12 are adjacent to each other in the Y direction and mutually connected at both nodes. The nanosheets 21a and the nanosheets 21c are opposed to each other in the Y direction, the faces of the nanosheets 21a closer to the nanosheets 21c are exposed from the gate interconnect 31a, and the faces of the nanosheets 21c closer to the nanosheets 21a are exposed from the gate interconnect 32a. This can reduce the distance between the nanosheets 21a and the nanosheets 21c required to isolate the gate of the transistor N11 and the gate of the transistor N12 from each other. Therefore, since the size of the capacitive element in the Y direction can be reduced, the layout structure of the capacitive element having a high breakdown voltage formed using forksheet FETs can be implemented in a reduced area.

While the two transistors constituting a capacitive structure are mutually connected at both nodes, i.e., at both the source and the drain, in this embodiment, they may be mutually connected at only either one of the nodes. That is, the two transistors constituting a capacitive structure may be mutually connected at at least either one of the nodes.

While the transistors arranged in the X direction share one node in this embodiment, the sharing of the node is not necessarily required.

While each capacitive structure is constituted by n-type transistors in this embodiment, it may be constituted by p-type transistors. Also, the capacitive element may include both a capacitive structure made of n-type transistors and a capacitive structure made of p-type transistors. For example, in the capacitive element of FIG. 3, the n-type transistors N11 to N14 in the upper part may be replaced with p-type transistors.

While two capacitive structures are arranged side by side in the X direction in this embodiment, three or more ones may be arranged. Also, more capacitive structures may be arranged in a line in the Y direction.

(Alteration)

Figure 4:
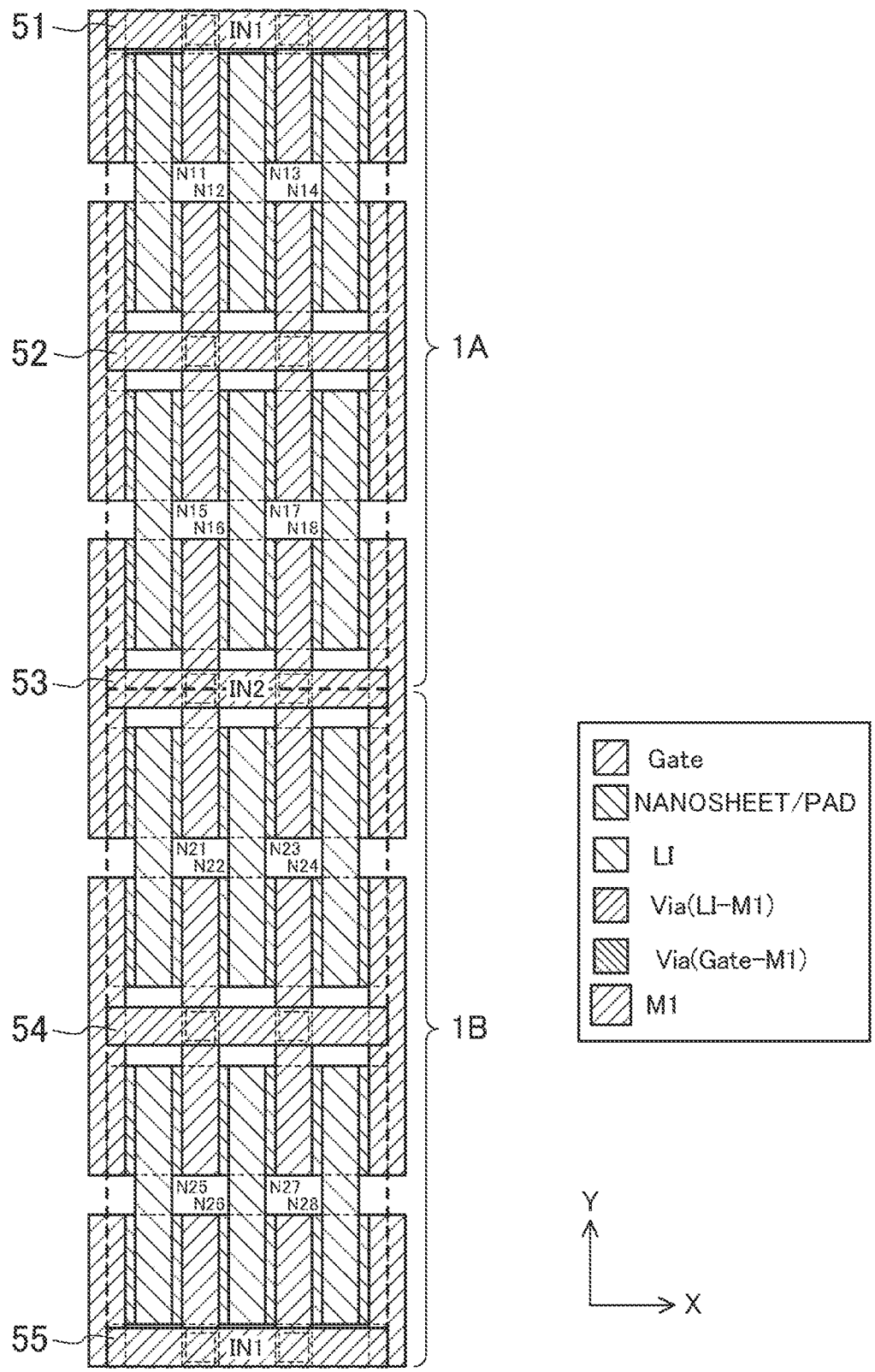
FIG. 4 is a plan view showing a layout structure of a capacitive element according to an alteration of the first embodiment.

FIG. 4 is a plan view showing a layout structure of a capacitive element according to an alteration of the first embodiment. The layout structure of FIG. 4 corresponds to one obtained by placing two capacitive elements, each identical to the capacitive element of FIG. 1, side by side in the Y direction. That is, capacitive structures 1A and 1B both have a configuration similar to that of the capacitive element of FIG. 1.

Figure 5:
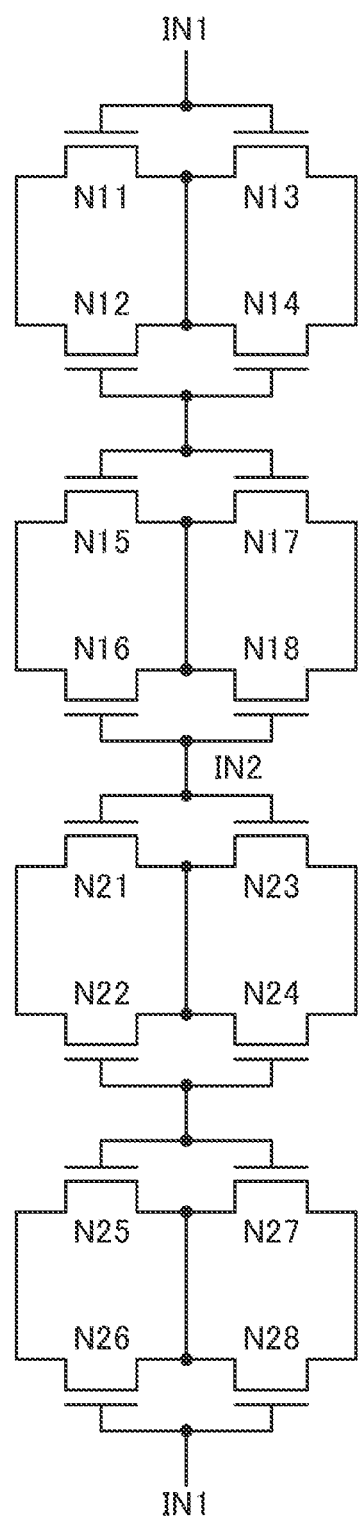
FIG. 5 is a circuit diagram of the capacitive element shown in FIG. 4.

FIG. 5 is a circuit diagram showing a configuration of the capacitive element shown in FIG. 4. The capacitive element of FIG. 5 is connected to two nodes IN1. Transistors N11 to N18 are placed between one of the nodes IN1 and a node IN2, and transistors N21 to N28 are placed between the node IN2 and the other of the nodes IN1.

The gates of the transistors N11 and N13 are connected to the node IN1, the gates of the transistors N12, N14, N15, and N17 are mutually connected, and the gates of the transistors N16 and N18 are connected to the node IN2. The transistors N11 and N12 are mutually connected at both nodes, the transistors N13 and N14 are mutually connected at both nodes, the transistors N15 and N16 are mutually connected at both nodes, and the transistors N17 and N18 are mutually connected at both nodes. The transistors N11 and N13 share one node, the transistors N12 and N14 share one node, the transistors N15 and N17 share one node, and the transistors N16 and N18 share one node.

The gates of the transistors N21 and N23 are connected to the node IN2, the gates of the transistors N22, N24, N25, and N27 are mutually connected, and the gates of the transistors N26 and N28 are connected to the node IN1. The transistors N21 and N22 are mutually connected at both nodes, the transistors N23 and N24 are mutually connected at both nodes, the transistors N25 and N26 are mutually connected at both nodes, and the transistors N27 and N28 are mutually connected at both nodes. The transistors N21 and N23 share one node, the transistors N22 and N24 share one node, the transistors N25 and N27 share one node, and the transistors N26 and N28 share one node.

In the structure of FIG. 5, four stages of transistors are serially connected between the node IN1 and the node IN2. That is, the voltage applied to the transistors N11 to N18 and N21 to N28 is ¼ of the voltage across the nodes IN1-IN2. It is therefore possible to apply, to this capacitive element, a voltage higher than the breakdown voltage of the transistors N11 to N18 and N21 to N28.

In the layout structure of FIG. 4, metal interconnects 51, 52, 53, 54, and 55 extending in the X direction are formed in an M1 interconnect layer. The metal interconnects 51 and 55 correspond to the nodes IN1 of the capacitive element, and the metal interconnect 53 corresponds to the node IN2 of the capacitive element.

Both the capacitive structures 1A and 1B have a configuration similar to that of the capacitive element of FIG. 1. Therefore, as in the above embodiment, since the gates of the transistors placed between the nodes IN1 and IN2 can be isolated from each other with a small inter-nanosheet distance between them, the size of the capacitive element in the Y direction can be reduced.

The number of stages of transistors serially connected between the node IN1 and the node IN2 is not limited to four, but may be larger than four. It is also possible to serially connect transistors of an odd number of stages, such as three stages. In this case, one of the nodes IN1 and IN2 will be connected to the nodes of transistors, not the gates thereof.

Second Embodiment

Figure 6:
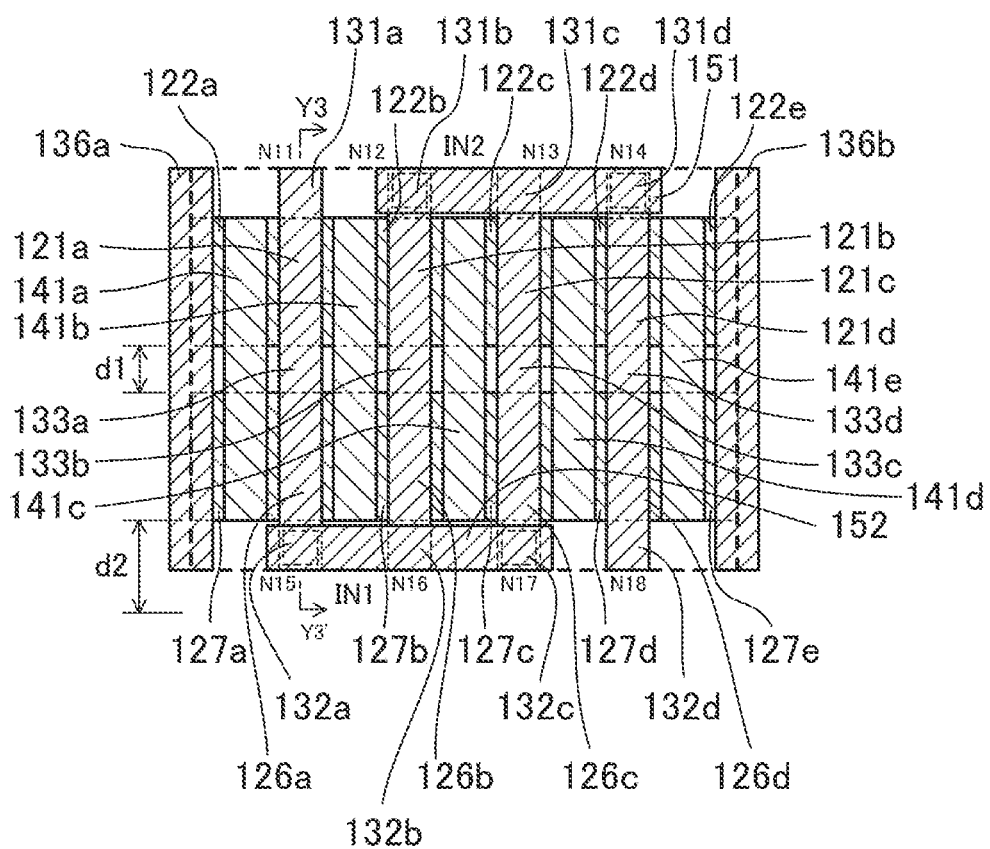
FIG. 6 is a plan view showing a layout structure of a capacitive element according to the second embodiment.
Figure 7:
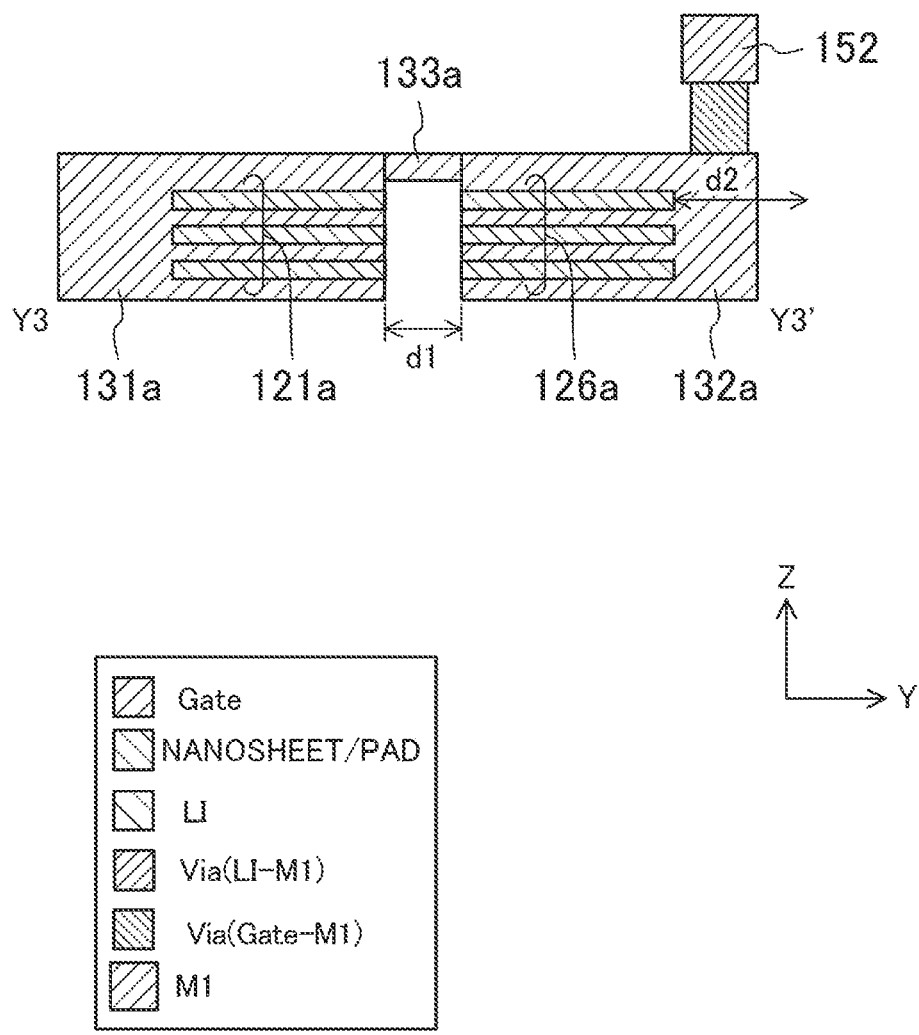
FIG. 7 is a cross-sectional view of the layout structure of FIG. 6 taken vertically as viewed in plan.

FIGS. 6 and 7 are views showing a layout structure of a capacitive element according to the second embodiment, where FIG. 6 is a plan view and FIG. 7 is a cross-sectional view taken vertically as viewed in plan. Specifically, FIG. 7 shows a cross section taken along line Y3-Y3'.

Figure 8:
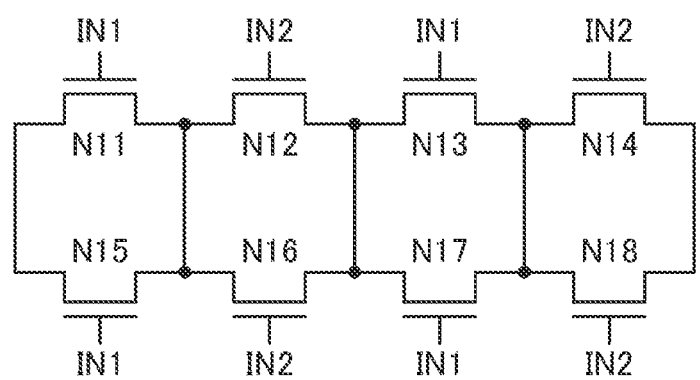
FIG. 8 is a circuit diagram of the capacitive element shown in FIGS. 6 and 7.

FIG. 8 is a circuit diagram showing the configuration of the capacitive element shown in FIGS. 6 and 7. N-type transistors N11, N12, N13, N14, N15, N16, N17, and N18 are placed between a node IN1 and a node IN2. The gates of the transistors N11, N13, N15, and N17 are connected to the node IN1, and the gates of the transistors N12, N14, N16, and N18 are connected to the node IN2. The transistors N11 and N15 are mutually connected at both nodes, the transistors N12 and N16 are mutually connected at both nodes, the transistors N13 and N17 are mutually connected at both nodes, and the transistors N14 and N18 are mutually connected at both nodes. The transistors N11 and N12 share one node, the transistors N12 and N13 share one node, and the transistors N13 and N14 share one node. The transistors N15 and N16 share one node, the transistors N16 and N17 share one node, and the transistors N17 and N18 share one node.

The capacitive element of FIG. 8 has a configuration of four capacitive structures, each constituted by two transistors mutually connected at one node, provided between the node IN1 and the node IN2. That is, the capacitive element of FIG. 8 includes a capacitive structure made of the transistors N11 and N12, a capacitive structure made of the transistors N13 and N14, a capacitive structure made of the transistors N15 and N16, and a capacitive structure made of the transistors N17 and N18.

As shown in FIG. 6, the n-type transistors N11 to N18 are arranged in an array of four in the X direction and two in the Y direction. That is, the transistors N11, N12, N13, and N14 are arranged in a line in the X direction, and the transistors N15, N16, N17, and N18 are arranged in a line in the X direction. The transistors N11 and N15 are arranged side by side in the Y direction, the transistors N12 and N16 are arranged side by side in the Y direction, the transistors N13 and N17 are arranged side by side in the Y direction, and the transistors N14 and N18 are arranged side by side in the Y direction.

The transistors N11 to N14 have, as channel portions, nanosheets 121a, 121b, 121c, and 121d, respectively, each having a stacked structure of three sheets overlapping as viewed in plan. The transistors N15 to N18 have, as channel portions, nanosheets 126a, 126b, 126c, and 126d, respectively, each having a stacked structure of three sheets overlapping as viewed in plan. That is, the transistors N11 to N14 and N15 to N18 are nanosheet FETs.

As shown in FIG. 6, pads 122a, 122b, 122c, 122d, and 122e, each formed of an integral semiconductor layer connected to the stacked structure of three sheets, are formed on the left side of the nanosheets 121a in the figure, between the nanosheets 121a and 121b, between the nanosheets 121b and 121c, between the nanosheets 121c and 121d, and on the right side of the nanosheet 121d in the figure, respectively. The pads 122a and 122b are to be the source region and drain region of the transistor N11, the pads 122b and 122c are to be the source region and drain region of the transistor N12, the pads 122c and 122d are to be the source region and drain region of the transistor N13, and the pads 122d and 122e are to be the source region and drain region of the transistor N14.

Pads 127a, 127b, 127c, 127d, and 127e, each formed of an integral semiconductor layer connected to the stacked structure of three sheets, are formed on the left side of the nanosheets 126a in the figure, between the nanosheets 126a and 126b, between the nanosheets 126b and 126c, between the nanosheets 126c and 126d, and on the right side of the nanosheet 126d in the figure, respectively. The pads 127a and 127b are to be the source region and drain region of the transistor N15, the pads 127b and 127c are to be the source region and drain region of the transistor N16, the pads 127c and 127d are to be the source region and drain region of the transistor N17, and the pads 127d and 127e are to be the source region and drain region of the transistor N18.

Gate interconnects 131a, 131b, 131c, and 131d extending in parallel in the Y direction are formed in the region of the transistors N11 to N14. Gate interconnects 132a, 132b, 132c, and 132d extending in parallel in the Y direction are formed in the region of the transistors N15 to N18. The gate interconnects 131a and 132a are arranged in a line in the Y direction, the gate interconnects 131b and 132b are arranged in a line in the Y direction, the gate interconnects 131c and 132c are arranged in a line in the Y direction, and the gate interconnects 131d and 132d are arranged in a line in the Y direction. Also, dummy gate interconnects 136a and 136b are formed on the outer sides of the gate interconnects 131a to 131d and 132a to 132d in the X direction.

The gate interconnect 131a surrounds the peripheries of the nanosheets 121a of the transistor N11 in the Y and Z directions through gate insulating films (not shown). The gate interconnect 131a is to be the gate of the transistor N11. Similarly, the gate interconnects 131b, 131c, and 131d surround the peripheries of the nanosheets 121b, 121c, and 121d of the transistors N12, N13, and N14, respectively, in the Y and Z directions through gate insulating films (not shown). The gate interconnects 131b, 131c, and 131d are to be the gates of the transistors N12, N13, and N14, respectively.

The gate interconnect 132a surrounds the peripheries of the nanosheets 126a of the transistor N15 in the Y and Z directions through gate insulating films (not shown). The gate interconnect 132a is to be the gate of the transistor N15. Similarly, the gate interconnects 132b, 132c, and 132d surround the peripheries of the nanosheets 126b, 126c, and 126d of the transistors N16, N17, and N18, respectively, in the Y and Z directions through gate insulating films (not shown). The gate interconnects 132b, 132c, and 132d are to be the gates of the transistors N16, N17, and N18, respectively.

The gate interconnects 131a and 132a arranged in the Y direction are mutually connected through a bridge 133a as a gate connection portion formed between the gate interconnects 131a and 132a. The gate interconnects 131b and 132b arranged in the Y direction are mutually connected through a bridge 133b formed between the gate interconnects 131b and 132b. The gate interconnects 131c and 132c arranged in the Y direction are mutually connected through a bridge 133c formed between the gate interconnects 131c and 132c. The gate interconnects 131d and 132d arranged in the Y direction are mutually connected through a bridge 133d formed between the gate interconnects 131d and 132d.

Local interconnects 141a, 141b, 141c, 141d, and 141e extending in the Y direction are formed in a local interconnect layer. The local interconnect 141*a* is connected with the pads 122*a* and 127*a*, the local interconnect 141*b* is connected with the pads 122*b* and 127*b*, the local interconnect 141*c* is connected with the pads 122*c* and 127*c*, the local interconnect 141*d* is connected with the pads 122*d* and 127*d*, and the local interconnect 141*e* is connected with the pads 122*e* and 127*e*.

Metal interconnects 151 and 152 extending in the X direction are formed in an M1 interconnect layer. The metal interconnect 152 corresponds to the node IN1 of the capacitive element, and the metal interconnect 151 corresponds to the node IN2 of the capacitive element. The metal interconnect 151 is connected to the gate interconnects 131*b* and 131*d* through vias, and the metal interconnect 152 is connected to the gate interconnects 132*a* and 132*c* through vias.

The nanosheets 121*a* and the nanosheets 126*a* are opposed to each other in the Y direction. The faces of the nanosheets 121*a* closer to the nanosheets 126*a* in the Y direction are exposed from the gate interconnect 131*a*, not covered with the gate interconnect 131*a*. The faces of the nanosheets 126*a* closer to the nanosheets 121*a* in the Y direction are exposed from the gate interconnect 132*a*, not covered with the gate interconnect 132*a*.

Similarly, the nanosheets 121*b* and the nanosheets 126*b* are opposed to each other in the Y direction, the nanosheets 121*c* and the nanosheets 126*c* are opposed to each other in the Y direction, and the nanosheets 121*d* and the nanosheets 126*d* are opposed to each other in the Y direction. The faces of the nanosheets 121*b*, 121*c*, and 121*d* closer to the nanosheets 126*b*, 126*c*, and 126*d* in the Y direction are exposed from the gate interconnects 131*b*, 131*c*, and 131*d*, not covered with the gate interconnects 131*b*, 131*c*, and 131*d*, respectively. The faces of the nanosheets 126*b*, 126*c*, and 126*d* closer to the nanosheets 121*b*, 121*c*, and 121*d* in the Y direction are exposed from the gate interconnects 132*b*, 132*c*, and 132*d*, not covered with the gate interconnects 132*b*, 132*c*, and 132*d*, respectively.

With the above configuration, the distance between the transistors N11 to N14 and the transistors N15 to N18 can be reduced (d1<d2). Therefore, the size of the capacitive element in the Y direction can be reduced.

As described above, according to this embodiment, a capacitive structure constituting the capacitive element includes, for example: the transistor N11 having the nanosheets 121*a* extending in the X direction and the gate interconnect 131*a* extending in the Y direction and surrounding the peripheries of the nanosheets 121*a*; and the transistor N12 having the nanosheets 121*b* extending in the X direction and the gate interconnect 131*b* extending in the Y direction and surrounding the peripheries of the nanosheets 121*b*. The transistors N11 and N12 are adjacent to each other in the X direction and mutually connected at one node. The faces of the nanosheets 121*a* on a first side in the Y direction (the lower side in the figure in this case) are exposed from the gate interconnect 131*a*, and the faces of the nanosheets 121*b* on the first side in the Y direction (the lower side in the figure in this case) are exposed from the gate interconnect 131*b*. This can reduce the distance between this capacitive structure and the capacitive structure, constituted by the transistors N15 and N16, adjacent thereto on the first side in the Y direction. Therefore, the size of the capacitive element in the Y direction can be reduced.

Also, in the capacitive structure constituted by the transistors N15 and N16, the faces of the nanosheets 126*a* on a first side in the Y direction (the upper side in the figure in this case) are exposed from the gate interconnect 132*a*, and the faces of the nanosheets 126*b* on the first side in the Y direction (the upper side in the figure in this case) are exposed from the gate interconnect 132*b*. This can reduce the distance between this capacitive structure and the capacitive structure, constituted by the transistors N11 and N12, adjacent thereto on the first side in the Y direction. Therefore, the size of the capacitive element in the Y direction can be reduced.

While each capacitive structure is constituted by n-type transistors in this embodiment, it may be constituted by p-type transistors. Also, the capacitive element may include both a capacitive structure made of n-type transistors and a capacitive structure made of p-type transistors.

While two capacitive structure are arranged in the X direction in this embodiment, three or more ones may be arranged. Also, more capacitive structures may be arranged in the Y direction.

Third Embodiment

Figure 9:
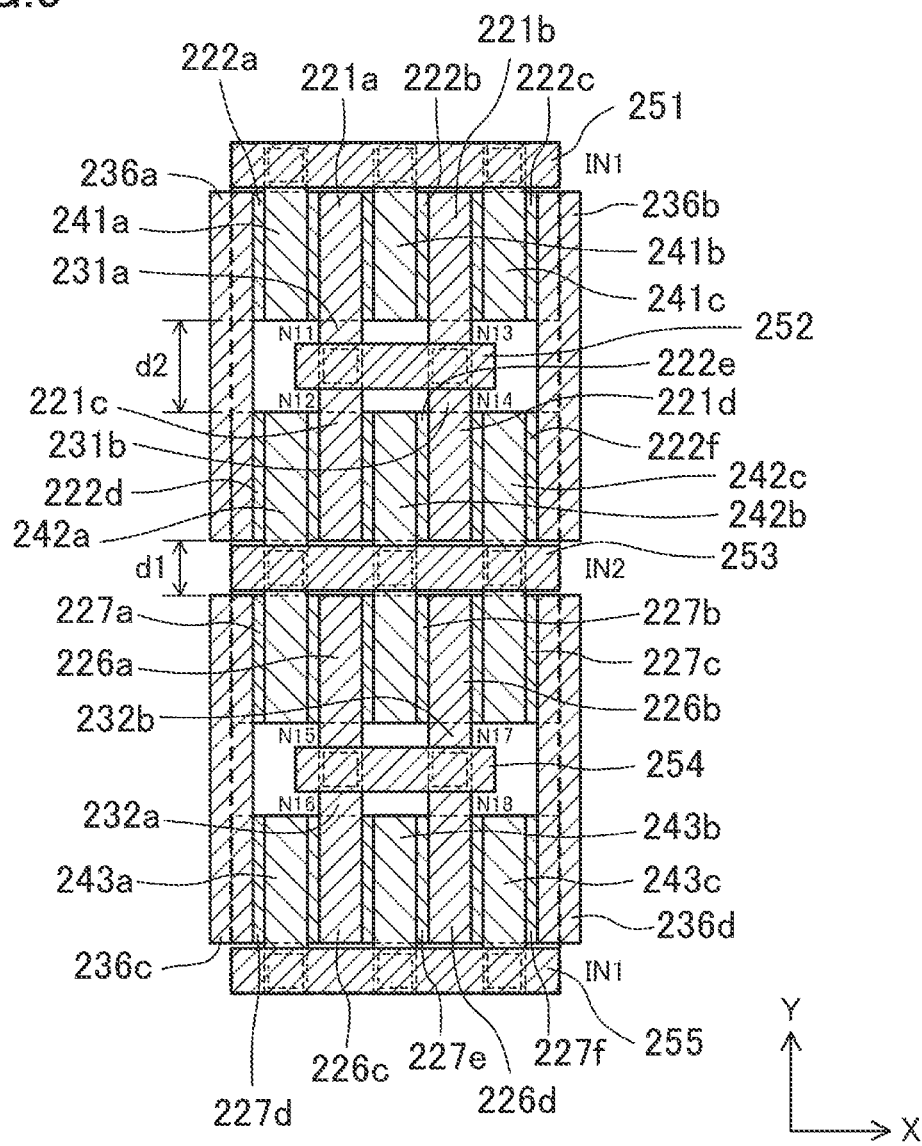
FIG. 9 is a plan view showing a layout structure of a capacitive element according to the third embodiment.
Figure 10:
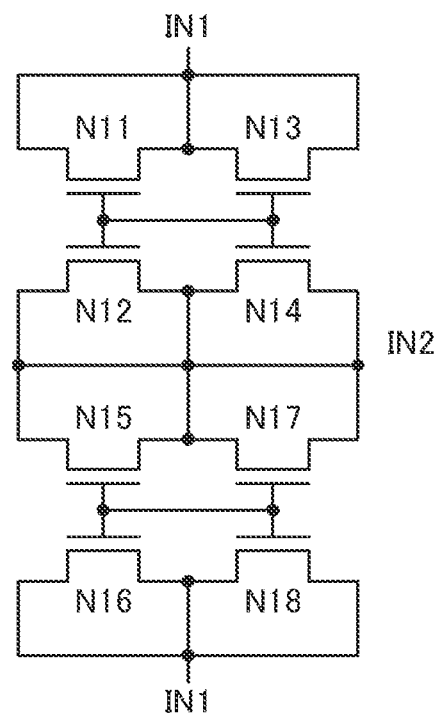
FIG. 10 is a circuit diagram of the capacitive element shown in FIG. 9.

FIG. 9 is a view showing a layout structure of a capacitive element according to the third embodiment. FIG. 10 is a circuit diagram showing the configuration of the capacitive element shown in FIG. 9. The semiconductor integrated circuit device according to this embodiment includes the capacitive element shown in FIG. 10. Nodes IN1 and IN2 receive signals, for example. Otherwise, the nodes IN1 and IN2 are connected to power supply lines. In this case, the capacitive element functions as an inter-power supply capacitance.

The capacitive element of FIG. 10 is connected to two nodes IN1. N-type transistors N11, N12, N13, and N14 are placed between one of the nodes IN1 and the node IN2. Both nodes of the transistors N11 and N13 are connected to the node IN1, and both nodes of the transistors N12 and N14 are connected to the node IN2. The gates of the transistors N11, N12, N13, and N14 are mutually connected.

N-type transistors N15, N16, N17, and N18 are placed between the node IN2 and the other of the nodes IN1. Both nodes of the transistors N15 and N17 are connected to the node IN2, and both nodes of the transistors N16 and N18 are connected to the node IN1. The gates of the transistors N15, N16, N17, and N18 are mutually connected.

In the configuration of FIG. 10, the voltage applied to the transistors N11 to N18 is ½ of the voltage across the nodes IN1-IN2. It is therefore possible to apply, to this capacitive element, a voltage higher than the breakdown voltage of the transistors N11 to N18.

The capacitive element of FIG. 10 has a configuration of four capacitive structures, each constituted by two transistors mutually connected at the gate, provided between the node IN1 and the node IN2. That is, the capacitive element of FIG. 10 includes a capacitive structure made of the transistors N11 and N12, a capacitive structure made of the transistors N13 and N14, a capacitive structure made of the transistors N15 and N16, and a capacitive structure made of the transistors N17 and N18.

As shown in FIG. 9, the n-type transistors N11 to N18 are arranged in an array of two in the X direction and four in the Y direction. That is, the transistors N11 and N13 are arranged side by side in the X direction, the transistors N12 and N14 are arranged side by side in the X direction, the transistors N15 and N17 are arranged side by side in the X direction, and the transistors N16 and N18 are arranged side by side in the X direction. The transistors N11, N12, N15, and N16 are arranged in a line in the Y direction, and the transistors N13, N14, N17, and N18 are arranged in a line in the Y direction.

The transistors N11 to N14 have, as channel portions, nanosheets 221a, 221c, 221b, and 221d, respectively, each having a stacked structure of three sheets overlapping as viewed in plan. The transistors N15 to N18 have, as channel portions, nanosheets 226a, 226c, 226b, and 226d, respectively, each having a stacked structure of three sheets overlapping as viewed in plan. That is, the transistors N11 to N14 and N15 to N18 are nanosheet FETs.

As shown in FIG. 9, pads 222a, 222b, and 222c, each formed of an integral semiconductor layer connected to the stacked structure of three sheets, are formed on the left side of the nanosheets 221a in the figure, between the nanosheets 221a and 221b, and on the right side of the nanosheet 221b in the figure, respectively. The pads 222a and 222b are to be the source region and drain region of the transistor N11, and the pads 222b and 222c are to be the source region and drain region of the transistor N13. Pads 222d, 222e, and 222f, each formed of an integral semiconductor layer connected to the stacked structure of three sheets, are formed on the left side of the nanosheets 221c in the figure, between the nanosheets 221c and 221d, and on the right side of the nanosheet 221d in the figure, respectively. The pads 222d and 222e are to be the source region and drain region of the transistor N12, and the pads 222e and 222f are to be the source region and drain region of the transistor N14.

Pads 227a, 227b, and 227c, each formed of an integral semiconductor layer connected to the stacked structure of three sheets, are formed on the left side of the nanosheets 226a in the figure, between the nanosheets 226a and 226b, and on the right side of the nanosheet 226b in the figure, respectively. The pads 227a and 227b are to be the source region and drain region of the transistor N15, and the pads 227b and 227c are to be the source region and drain region of the transistor N17. Pads 227d, 227e, and 227f, each formed of an integral semiconductor layer connected to the stacked structure of three sheets, are formed on the left side of the nanosheets 226c in the figure, between the nanosheets 226c and 226d, and on the right side of the nanosheet 226d in the figure, respectively. The pads 227d and 227e are to be the source region and drain region of the transistor N16, and the pads 227e and 227f are to be the source region and drain region of the transistor N18.

Gate interconnects 231a and 231b extending in parallel in the Y direction are formed in the region of the transistors N11 to N14. Gate interconnects 232a and 232b extending in parallel in the Y direction are formed in the region of the transistors N15 to N18. The gate interconnects 231a and 232a are arranged in a line in the Y direction, and the gate interconnects 231b and 232b are arranged in a line in the Y direction. Also, dummy gate interconnects 236a and 236b are formed on the outer sides of the gate interconnects 231a and 231b in the X direction, and dummy gate interconnects 236c and 236d are formed on the outer sides of the gate interconnects 232a and 232b in the X direction.

The gate interconnect 231a surrounds the peripheries of the nanosheets 221a of the transistor N11 and the nanosheets 221c of the transistor N12 in the Y and Z directions through gate insulating films (not shown). The gate interconnect 231a is to be the gates of the transistors N11 and N12. The gate interconnect 231b surrounds the peripheries of the nanosheets 221b of the transistor N13 and the nanosheets 221d of the transistor N14 in the Y and Z directions through gate insulating films (not shown). The gate interconnect 231b is to be the gates of the transistors N13 and N14.

The gate interconnect 232a surrounds the peripheries of the nanosheets 226a of the transistor N15 and the nanosheets 226c of the transistor N16 in the Y and Z directions through gate insulating films (not shown). The gate interconnect 232a is to be the gates of the transistors N15 and N16. The gate interconnect 232b surrounds the peripheries of the nanosheets 226b of the transistor N17 and the nanosheets 226d of the transistor N18 in the Y and Z directions through gate insulating films (not shown). The gate interconnect 232b is to be the gates of the transistors N17 and N18.

Local interconnects 241a, 241b, and 241c extending in parallel in the Y direction, local interconnects 242a, 242b, and 242c extending in parallel in the Y direction, and local interconnects 243a, 243b, and 243c extending in parallel in the Y direction are formed in a local interconnect layer. The local interconnect 241a is connected with the pad 222a, the local interconnect 241b is connected with the pad 222b, and the local interconnect 241c is connected with the pad 222c. The local interconnect 242a is connected with the pads 222d and 227a, the local interconnect 242b is connected with the pads 222e and 227b, and the local interconnect 242c is connected with the pads 222f and 227c. The local interconnect 243a is connected with the pad 227d, the local interconnect 243b is connected with the pad 227e, and the local interconnect 243c is connected with the pad 227f.

Metal interconnects 251, 252, 253, 254, and 255 extending in the X direction are formed in an M1 interconnect layer. The metal interconnects 251 and 255 correspond to the nodes IN1 of the capacitive element, and the metal interconnect 253 corresponds to the node IN2 of the capacitive element. The metal interconnect 251 is connected to the local interconnects 241a, 241b, and 241c through vias. The metal interconnect 252 is connected to the gate interconnects 231a and 231b through vias. The metal interconnect 253 is connected to the local interconnects 242a, 242b, and 242c through vias. The metal interconnect 254 is connected to the gate interconnects 232a and 232b through vias. The metal interconnect 255 is connected to the local interconnects 243a, 243b, and 243c through vias.

The nanosheets 221c and the nanosheets 226a are opposed to each other in the Y direction. The faces of the nanosheets 221c closer to the nanosheets 226a in the Y direction are exposed from the gate interconnect 231a, not covered with the gate interconnect 231a. The faces of the nanosheets 226a closer to the nanosheets 221c in the Y direction are exposed from the gate interconnect 232a, not covered with the gate interconnect 232a. Similarly, the nanosheets 221d and the nanosheets 226b are opposed to each other in the Y direction. The faces of the nanosheets 221d closer to the nanosheets 226b in the Y direction are exposed from the gate interconnect 231b, not covered with the gate interconnect 231b. The faces of the nanosheets 226b closer to the nanosheets 221d in the Y direction are exposed from the gate interconnect 232b, not covered with the gate interconnect 232b.

Also, the faces of the nanosheets 221a on the upper side in the figure in the Y direction are exposed from the gate interconnect 231a, not covered with the gate interconnect 231a. The faces of the nanosheets 221b on the upper side in the figure in the Y direction are exposed from the gate interconnect 231b, not covered with the gate interconnect 231b. The faces of the nanosheets 226c on the lower side in the figure in the Y direction are exposed from the gate interconnect 232a, not covered with the gate interconnect 232a. The faces of the nanosheets 226d on the lower side in the figure in the Y direction are exposed from the gate interconnect 232b, not covered with the gate interconnect 232b.

In the circuit of FIG. 10, the gates of the transistors N11 to N14 and the gates of the transistors N15 to N18 are isolated from each other. It is therefore necessary to isolate the gate interconnect 231a and the gate interconnect 232a from each other, and the gate interconnect 231b and the gate interconnect 232b from each other. On the other hand, with the configuration described above, the distance between the nanosheets 221c and 226a and between the nanosheets 221d and 226b can be reduced (d1<d2).

Therefore, since the gates of the adjacent transistors included in two capacitive structures connected to the node IN2 can be isolated from each other with a small inter-nanosheet distance between them, the size of the capacitive element in the Y direction can be reduced.

As described above, according to this embodiment, a capacitive structure constituting the capacitive element includes, for example, the transistor N11 having the nanosheets 221a extending in the X direction and the transistor N12 having the nanosheets 221c extending in the X direction. The transistors N11 and N12 are adjacent to each other in the Y direction, and the gate interconnect 231a is formed to surround the peripheries of the nanosheets 221a and 221c. The faces of the nanosheets 221c on the side away from the nanosheets 221a in the Y direction are exposed from the gate interconnects 231a. This can reduce the distance between this capacitive structure and the capacitive structure, constituted by the transistors N15 and N16, adjacent thereto on the transistor N12 side in the Y direction. Therefore, since the size of the capacitive element in the Y direction can be reduced, a layout structure of a high-breakdown voltage capacitive element using forksheet FETs can be implemented in a reduced area.

Also, in the capacitive structure constituted by the transistors N15 and N16, the faces of the nanosheets 226a on the side away from the nanosheets 226c in the Y direction are exposed from the gate interconnects 232a. This can reduce the distance between this capacitive structure and the capacitive structure, constituted by the transistors N11 and N12, adjacent thereto on the transistor N15 side in the Y direction. Therefore, the size of the capacitive element in the Y direction can be reduced.

While the transistors constituting a capacitive structure are connected to the node IN1 or the node IN2 at both nodes, i.e., at both the source and the drain, in this embodiment, they may be connected at only either one of the nodes.

While the gates of the transistors arranged side by side in the X direction are mutually connected in this embodiment, they may not be necessarily mutually connected.

While each capacitive structure is constituted by n-type transistors in this embodiment, it may be constituted by p-type transistors. Also, the capacitive element may include both a capacitive structure made of n-type transistors and a capacitive structure made of p-type transistors. For example, in the capacitive element of FIG. 10, the n-type transistors N11 to N14 in the upper part may be replaced with p-type transistors.

While two capacitive structures are arranged in the X direction in this embodiment, three or more ones may be arranged. Also, more capacitive structures may be arranged in the Y direction.

(Alteration)

Figure 12:
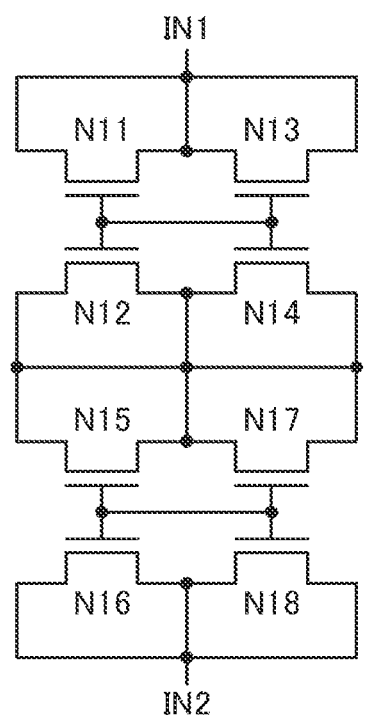
FIG. 12 is a circuit diagram of the capacitive element shown in FIG. 11.

FIG. 11 is a view showing a layout structure of a capacitive element according to an alteration of the third embodiment. FIG. 12 is a circuit diagram showing a configuration of the capacitive element shown in FIG. 11. The capacitive element shown in FIGS. 11 and 12 is similar to the capacitive element shown in FIGS. 9 and 10 in both the layout structure and the circuit configuration, but is different therefrom in the connection relations with the nodes IN1 and IN2.

That is, in FIG. 11, the metal interconnect 251 corresponds to the node IN1 of the capacitive element, and the metal interconnect 255 corresponds to the node IN2 of the capacitive element.

In this alteration, four stages of n-type transistors are serially connected between the node IN1 and the node IN2, where the transistors N11 and N13 are connected to the node IN1, and the transistors N16 and N18 are connected to the node IN2.

In this alteration, also, as in the above embodiment, since the gates of the adjacent transistors included in two capacitive structures connected between the node IN1 and the node IN2 can be isolated from each other with a small inter-nanosheet distance between them, the size of the capacitive element in the Y direction can be reduced.

According to the present disclosure, a layout structure of a high-breakdown voltage capacitive element using forksheet FETs can be implemented in a reduced area. The present disclosure is therefore useful for downsizing and higher integration of semiconductor chips, for example.

What is claimed is:

1. A semiconductor integrated circuit device comprising a capacitive element, the capacitive element having at least one capacitive structure provided between a first node and a second node,
wherein
    the capacitive structure includes:
        a first transistor having a first nanosheet extending in a first direction and a first gate interconnect extending in a second direction perpendicular to the first direction formed to surround a periphery of the first nanosheet in the second direction and a third direction perpendicular to the first and second directions; and
        a second transistor having a second nanosheet extending in the first direction and a second gate interconnect extending in the second direction formed to surround a periphery of the second nanosheet in the second and third directions,
    the first and second transistors are adjacent to each other in the second direction and mutually connected at at least one node, and
    the first nanosheet and the second nanosheet are opposed to each other in the second direction, a face of the first nanosheet closer to the second nanosheet is exposed from the first gate interconnect, and a face of the second nanosheet closer to the first nanosheet is exposed from the second gate interconnect.

2. The semiconductor integrated circuit device of claim 1, wherein
    the first gate interconnect is connected to the first node, and the second gate interconnect is connected to the second node.

3. The semiconductor integrated circuit device of claim 1, wherein
    the capacitive element has a plurality of the capacitive structures,
    the plurality of capacitive structures include first and second capacitive structures placed side by side in the first direction, and
    the first transistor of the first capacitive structure and the first transistor of the second capacitive structure share one node, and the second transistor of the first capacitive structure and the second transistor of the second capacitive structure share one node.

4. The semiconductor integrated circuit device of claim 1, wherein the capacitive element has a plurality of the capacitive structures, the plurality of capacitive structures include first and second capacitive structures placed side by side in the second direction, and the second gate interconnect of the first capacitive structure and the first gate interconnect of the second capacitive structure are formed integrally.

5. The semiconductor integrated circuit device of claim 4, wherein the first gate interconnect of the first capacitive structure is connected to the first node, and the second gate interconnect of the second capacitive structure is connected to the second node.

6. A semiconductor integrated circuit device comprising a capacitive element, the capacitive element having at least one capacitive structure provided between a first node and a second node, wherein the capacitive structure includes:

a first transistor having a first nanosheet extending in a first direction and a first gate interconnect extending in a second direction perpendicular to the first direction formed to surround a periphery of the first nanosheet in the second direction and a third direction perpendicular to the first and second directions; and a second transistor having a second nanosheet extending in the first direction and a second gate interconnect extending in the second direction formed to surround a periphery of the second nanosheet in the second and third directions, the first and second transistors are adjacent to each other in the first direction and mutually connected at one node, and a face of the first nanosheet on a first side in the second direction is exposed from the first gate interconnect, and a face of the second nanosheet on the first side in the second direction is exposed from the second gate interconnect.

7. The semiconductor integrated circuit device of claim 6, wherein the first gate interconnect is connected to the first node, and the second gate interconnect is connected to the second node.

8. The semiconductor integrated circuit device of claim 6, wherein the capacitive element has a plurality of the capacitive structures, the plurality of capacitive structures include first and second capacitive structures placed side by side in the second direction, the first nanosheet of the first capacitive structure and the first nanosheet of the second capacitive structure are opposed to each other in the second direction, and the second nanosheet of the first capacitive structure and the second nanosheet of the second capacitive structure are opposed to each other in the second direction, and in the first capacitive structure, the first side is the side closer to the second capacitive structure, and in the second capacitive structure, the first side is the side closer to the first capacitive structure.

9. The semiconductor integrated circuit device of claim 8, wherein the first gate interconnect of the first capacitive structure and the first gate interconnect of the second capacitive structure are mutually connected through a first gate connector provided between the first gate interconnects, and the second gate interconnect of the first capacitive structure and the second gate interconnect of the second capacitive structure are mutually connected through a second gate connector provided between the second gate interconnects.

10. The semiconductor integrated circuit device of claim 6, wherein the capacitive element has a plurality of the capacitive structures, the plurality of capacitive structures include first and second capacitive structures placed side by side in the first direction, the second transistor of the first capacitive structure and the first transistor of the second capacitive structure share one node, and the first gate interconnect of the first capacitive structure and the first gate interconnect of the second capacitive structure are electrically connected to each other, and the second gate interconnect of the first capacitive structure and the second gate interconnect of the second capacitive structure are electrically connected to each other.

11. A semiconductor integrated circuit device comprising a capacitive element, the capacitive element having at least one capacitive structure provided between a first node and a second node, wherein the capacitive structure includes:

a first transistor having a first nanosheet extending in a first direction; and a second transistor having a second nanosheet extending in the first direction, the first and second transistors are adjacent to each other in a second direction perpendicular to the first direction, a first gate interconnect extending in the second direction is formed to surround peripheries of the first and second nanosheets in the second direction and a third direction perpendicular to the first and second directions, and a face of the second nanosheet on a side away from the first nanosheet in the second direction is exposed from the first gate interconnect.

12. The semiconductor integrated circuit device of claim 11, wherein a face of the first nanosheet on a side away from the second nanosheet in the second direction is exposed from the first gate interconnect.

13. The semiconductor integrated circuit device of claim 11, wherein at least either one node of the first transistor is connected to the first node, and at least either one node of the second transistor is connected to the second node.

14. The semiconductor integrated circuit device of claim 11, wherein the capacitive element has a plurality of the capacitive structures, the plurality of capacitive structures include first and second capacitive structures placed side by side in the second direction, and the second nanosheet of the first capacitive structure and the second nanosheet of the second capacitive structure are opposed to each other in the second direction.

15. The semiconductor integrated circuit device of claim 14, wherein
- the second transistor of the first capacitive structure and the second transistor of the second capacitive structure are mutually connected at at least one node, and
- at least either one node of the first transistor of the first capacitive structure is connected to the first node, and at least either one node of the first transistor of the second capacitive structure is connected to the second node.

* * * * *